(12) United States Patent
Dionne et al.

(10) Patent No.: US 9,472,694 B2
(45) Date of Patent: Oct. 18, 2016

(54) COMPOSITION AND METHOD FOR UPCONVERSION OF LIGHT AND DEVICES INCORPORATING SAME

(71) Applicant: The Board of Trustees of the Leland Stanford Junior University, Palo Alto, CA (US)

(72) Inventors: Jennifer Anne Dionne, Palo Alto, CA (US); Alberto Salleo, San Francisco, CA (US); Di Meng Wu, Stanford, CA (US)

(73) Assignee: The Board of Trustees of the Leland Stanford Junior UniversityCA (US)

( * ) Notice: Subject to any disclaimer, the term of this patent is extended or adjusted under 35 U.S.C. 154(b) by 213 days.

(21) Appl. No.: 13/796,902

(22) Filed: Mar. 12, 2013

(65) Prior Publication Data
US 2013/0276877 A1    Oct. 24, 2013

Related U.S. Application Data

(60) Provisional application No. 61/637,120, filed on Apr. 23, 2012.

(51) Int. Cl.
*H01L 31/044* (2014.01)
*H01L 31/0224* (2006.01)
*H01L 31/055* (2014.01)

(52) U.S. Cl.
CPC ........ *H01L 31/022425* (2013.01); *H01L 31/022466* (2013.01); *H01L 31/055* (2013.01); *Y02E 10/52* (2013.01)

(58) Field of Classification Search
CPC ....... H01L 31/00–31/078; Y02E 10/50–10/60
USPC .................................. 136/243–265
See application file for complete search history.

(56) References Cited

U.S. PATENT DOCUMENTS

| | | | |
|---|---|---|---|
| 2001/0023971 A1* | 9/2001 | Kondo et al. | 257/458 |
| 2006/0185719 A1* | 8/2006 | Putnam | 136/253 |
| 2009/0173381 A1* | 7/2009 | Kang et al. | 136/256 |
| 2010/0043872 A1* | 2/2010 | Richter et al. | 136/255 |
| 2010/0178417 A1* | 7/2010 | Connor et al. | 427/74 |
| 2011/0048508 A1* | 3/2011 | Afzali-Ardakani | H01L 51/002 136/252 |

(Continued)

FOREIGN PATENT DOCUMENTS

WO    2011078486 A2    6/2011
WO    2011082806 A2    7/2011

(Continued)

OTHER PUBLICATIONS

Boyer, J., van Veggel, F. C. J. M., Absolute Quantum Yield Measurements of Colloidal NaYF4:Er3+, Yb3+ Upconverting Nanoparticles, 2010, 2, 1417-1419.*

(Continued)

*Primary Examiner* — Bach Dinh
(74) *Attorney, Agent, or Firm* — Kaplan Breyer Schwarz & Ottesen, LLP

(57) ABSTRACT

An up-converting electrode and a solar cell that combines the up-converting electrode are disclosed. The up-converting electrode comprises a material that up-converts light from longer wavelengths to shorter wavelengths and an electrically conductive material. The electrically conductive material increases the efficiency of the up-converting material such that more light is up-converted. The up-converting electrode can also serve as an electrical contact for the solar cell.

18 Claims, 6 Drawing Sheets

(56) References Cited

U.S. PATENT DOCUMENTS

| | | | |
|---|---|---|---|
| 2011/0126889 A1* | 6/2011 | Bourke et al. | 136/253 |
| 2011/0214728 A1* | 9/2011 | Veerasamy | B82Y 10/00 |
| | | | 136/256 |
| 2012/0132930 A1* | 5/2012 | Young | H01L 31/0481 |
| | | | 257/84 |
| 2012/0167983 A1 | 7/2012 | Cho et al. | |
| 2012/0260984 A1 | 10/2012 | Han | |
| 2013/0042914 A1* | 2/2013 | Chan et al. | 136/257 |

FOREIGN PATENT DOCUMENTS

| | | |
|---|---|---|
| WO | 2011106730 A2 | 9/2011 |
| WO | 2012002602 A1 | 1/2012 |

OTHER PUBLICATIONS

Wild, J., Rath, J.K., Meijerink, A., van Sark, W.G.J.H.M., Schropp, R.E.I., Enhanced Near-infrared REsponse of a-Si:H Solar Cells with B-NaYF4:Yb3+ (18%), Er3+ (2%) upconversion phosphors., Solar Energy Materials & Solar Cells, 2010, 94, 2395-2398.*

Oscar Chao, "International Preliminary Report on Patentability and Written Opinion in corresponding PCT International Application No: PCT/US2013/030519", Oct. 28, 2014.

* cited by examiner

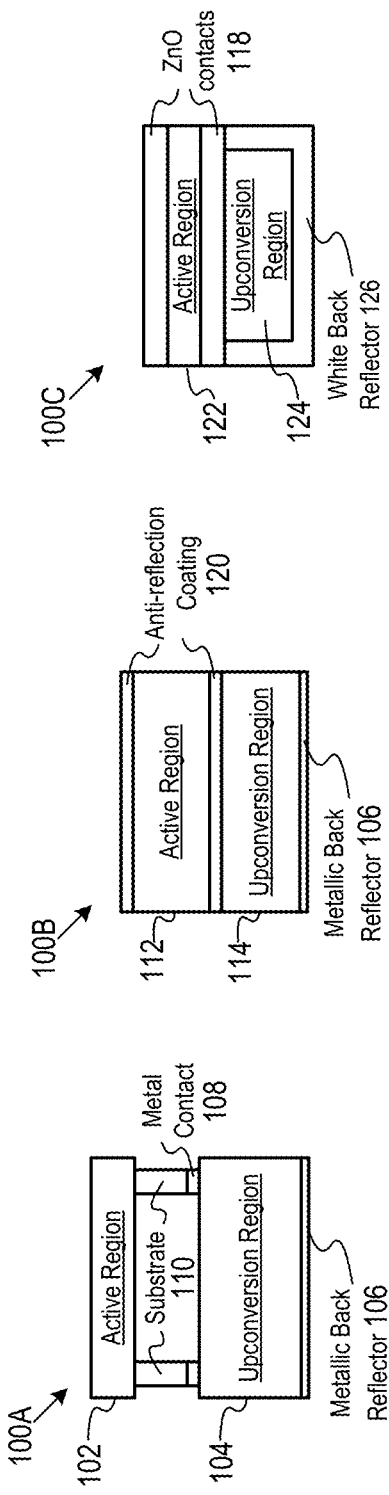
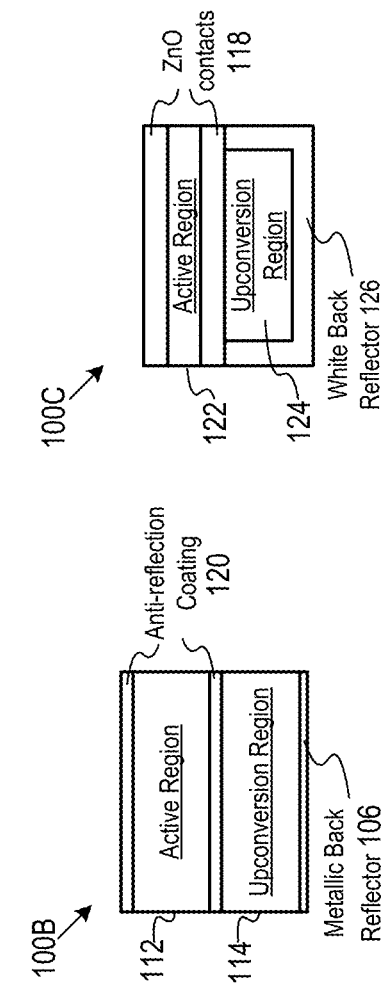
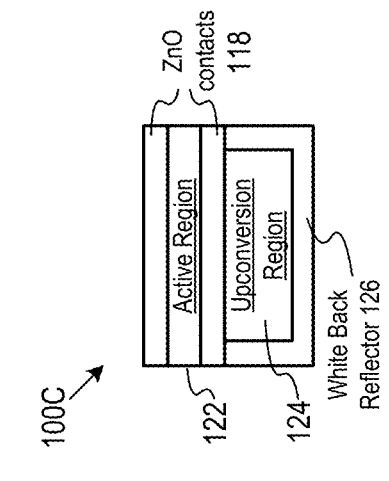
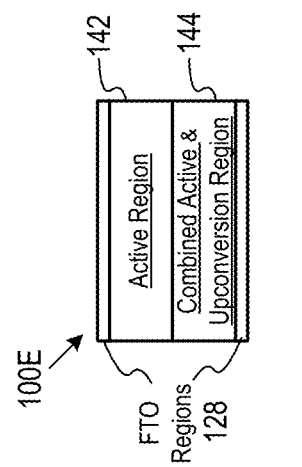
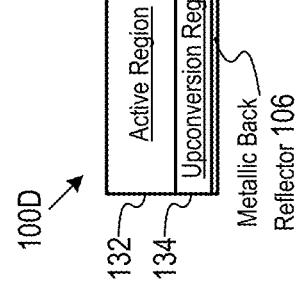

COMPOSITION AND METHOD FOR UPCONVERSION OF LIGHT AND DEVICES INCORPORATING SAME

STATEMENT OF RELATED CASES

This case claims priority of U.S. Provisional Patent Application 61/637,120 filed Apr. 23, 2012, which is incorporated by reference herein.

FIELD OF THE INVENTION

The present invention relates to a hybrid composition with optical and electrical properties in general, and, more particularly, to a material for up-converting light and conducting current.

BACKGROUND OF THE INVENTION

Pressure to use renewable energy sources is growing. One renewable energy source is the sun. Energy from the sun can be harvested by converting sunlight to electricity using a photovoltaic cell or a photoelectrochemical cell. Both such cells are commonly known as "solar cells."

A photoelectrochemical cell includes a photoactive semiconductor working electrode and a counter electrode made of either metal or semiconductors. Both of the electrodes are immersed in a suitable electrolyte. The materials used as electrodes must have a suitable optical functionality (absorption of solar energy) as well as a suitable catalytic functionality (for reactions such as water decomposition). There are several types of photoelectrochemical cells, including electrochemical photovoltaic, electrochemical photocatalytic, electrochemical photoelectrolytic cells. In systems using photocatalysis, the "catalyst" is typically either a semiconductor surface or an in-solution metal complex. In addition to producing electricity, photoelectrochemical cells can produce fuels (e.g., hydrogen, etc.).

A basic photovoltaic cell includes an "optically active" region in which electricity is generated and two contacts for extracting that electricity. The optically active region typically comprises abutting layers of n-type semiconductor and p-type semiconductor. A single p-n junction is created at the interface of the layers, thereby creating an electric field.

When sunlight shines on either a photoelectrochemical or a photovoltaic cell, it can be reflected, absorbed, or transmitted. Only the light that is absorbed in the optically active region ultimately generates electricity. More particularly, only photons having an energy that is at least equal to the band gap of the active region can free an electron from (the semiconductor material in) that region. It is those freed electrons, in conjunction with electric field(s) established in the active region, which create an electrical current. In other words, the photovoltaic cell can only use the portion of the sun's spectrum that is above the band gap of the absorbing material; lower-energy photons are not used. The band gap for most photovoltaics is 1.1-1.7 eV, which correlates to wavelengths in the range of about 1100 nanometers (nm) to about 730 nm.

One way to address the issue of the sun's "useful" spectrum is with a multi-junction cell. A multi-junction cell is essentially a stack of individual single-junction cells arranged in order of descending band-gap. Photons below the band gap of the first cell are not absorbed thereby and are transmitted to second cell. The second cell absorbs the higher-energy portion of the remaining solar radiation and remains transparent to photons below its band gap. This selective absorption process continues to the final cell, which has the lowest band-gap. In this way, multi-junction cells convert a greater range of the sun's energy spectrum to electricity than single-junction cells, thus potentially achieving higher total conversion efficiency.

Unfortunately, the increased efficiency of multi-junction photovoltaics comes at a price. Specifically, multi-junction cells require both photocurrent and lattice matching between the various semiconductor layers for high performance. Materials that satisfy these criteria are expensive and require costly deposition processes.

Another approach to improving the efficiency of a solar cell is through spectral conversion. In this process, the solar spectrum is altered to better match the wavelength-dependent conversion efficiency of the solar cell. In spectral up-conversion, two photons each having an energy lower than the band gap are converted to one photon having an energy above the band gap. The higher-energy photons produced by this process are directed back to the solar cell and can then be absorbed, thereby increasing the cell's maximum short-circuit current and, consequently, its efficiency.

Materials suitable for use as an "up-converter" will emit photons having a higher energy than the photons that the material absorbs. A two-step excitation process is required to up-convert the infrared part of the solar spectrum. Materials suitable for this process include lanthanide and transition metal ions, quantum dots, and metal-ligand complexes.

Thus far, only lanthanide up-converters have been used in solar cells. For up-conversion from near infrared to visible wavelengths, the most efficient material known is $NaYF_4$:$Yb^{3+}$, $Er^{3+}$, wherein $Yb^{3+}$ is the sensitizer and $Er^{3+}$ is the emitter. This material absorbs light at about 980 nm and up-converts it to green and red light (i.e., about 700 to 500 nm). In practice, up-conversion efficiency is low and to date most actual demonstrations have merely served as "proof-of-principle."

FIGS. 1A through 1E depict five different configurations for solar cells having up-conversion capability:

FIG. 1A depicts cell 100A, wherein active region 102 comprises gallium arsenide and up-conversion region 104 comprises vitroceramics.

FIG. 1B depicts cell 100B, wherein active region 112 comprises crystalline silicon and up-conversion region 114 comprises $NaYF_4$:20% $Er^{3+}$.

FIG. 1C depicts cell 100C, wherein active region 122 comprises amorphous silicon and up-conversion region 124 comprises $NaYF_4$:18% $Yb^{3+}$, 2% $Er^{3+}$.

FIG. 1D depicts cell 100D, which is a dye-sensitized solar cell ("DSSC") wherein active region 132 comprises titanium dioxide and up-conversion region 134 comprises YAG 3% $Yb^{3+}$, 0.5% $Er^{3+}$.

FIG. 1E depicts cell 100E, which is also a dye-sensitized solar cell ("DSSC") having active region 142 and a combined active/up-conversion region 144.

Cells 100A through 100D have a discrete, electrically-isolated layer of up-conversion material (i.e., layers 104, 114, 124, and 134), which is distinct from any other functional element of the cell. In cell 100E, the up-conversion material is not electrically isolated; rather, it is mixed with some of the titanium oxide, forming layer 144.

Back reflectors 106 (cells 100A through 100D) reflect all emitted photons back into the cell. As previously indicated, all solar cells have contacts for extracting the electricity formed in the active layer. For example, cell 100A includes metal contacts 108, cell 100C has ZnO contacts 118, and cell 100E incorporates FTO (fluorine-doped tine oxide) contacts 142. In cell 100B, which is a bifacial buried contact solar cell, the electrical contacts (not depicted) are embedded in grooves in active region 112. Cell 100D has transparent front and back contacts (not depicted).

Most prior-art up-converting solar cells include a transparent back electrode between the up-converting region and the active region of the cell (so that light can reach the up-converting region and then be reflected into the active region). This increases the cost of the solar cell, reduces the amount of sub-band gap light that can be absorbed by the up-converting region, and reduces the amount of up-coverted light that can be absorbed in the active region. Some other prior-art up-converting solar cells have both electrical contacts at the front of the cell, which limits the absorption of incident light. Up-converting solar cells are discussed in de Wild, et al., "Upconverter Solar Cells: materials and applications," *Energy Environ. Sci*, v4, 4835-4848 (2011); Ghozati et al., "Improved Fill-factor for the Double-Sided Buried-Contact Bifacial Silicon Solar Cell," *Solar Energy Materials and Solar Cells*, v51, 121-128 (1998); Liu et al, "Enhancing Near-Infrared Solar Cell Response Using Upconverting Transparent Ceramics," *Solar Energy Materials and Solar Cells*, v95, 800-803 (2011); Shan et al., "The Hidden Effects of Particle Shape and Criteria for Evaluating the Upconversion Luminescence of Lanthanide Doped nanophosphors," *J. Phys. Chem.*, v114, 2452-2461 (2010); and Wang et al., "Rare-Earth Ion Doped Upconversion Materials for Photovoltaic Applications," *Adv. Matl.*, v23, 2675-2680.

The art would therefore benefit from improvements in the structure and performance of up-conversion materials. For solar cell applications, this would increase the efficiency of such cells and reduce their cost relative to prior-art solar cells.

SUMMARY OF THE INVENTION

The present invention provides an up-converting material that has dual functionality: it functions as an optical up-converter as well as an electrical conductor/contact. That is, the up-converting layer or region has both optical properties and electrical properties. For that reason, the up-converting material disclosed herein is referred to as an "up-converting electrode."

The up-converting electrode disclosed herein comprises a hybrid film that includes an up-converting material and an electrically conductive material. In the illustrative embodiment, the up-converting material comprises $NaYF_4:Yb^{3+}$, $Er^{3+}$ nanoparticles and the electrically conductive material comprises silver (Ag) nanowires. In addition to (or as an aspect of) its electrical functionality, the silver nanowires significantly increase the up-conversion efficiency of the lanthanide-based up-converting material.

Among other technological applications, incorporating the up-converting electrode into a solar cell (either photovoltaic or photoelectrochemical) provides a way to increase its efficiency without some of the disadvantages of the prior art.

The illustrative embodiment of present invention is a photovoltaic solar cell that includes the up-converting electrode. In the illustrative embodiment, the up-converting electrode provides the functionality of both a "back electrode" and an "up-converting region." Since the "back electrode" and the "up-converting region" are effectively one and the same, there is no need for a transparent back electrode through which light must pass to reach the up-converting region, as in most prior-art up-converting solar cells. Nor is there a need to place both contacts at the front of the cell.

A further aspect of the present invention is an ability to improve the up-conversion performance of an up-converting material by tailoring the geometry (diameter, length, and shape) of the electrically conductive material (e.g., the silver nanowires).

BRIEF DESCRIPTION OF THE DRAWINGS

FIG. 1A depicts solar cell 100A in the prior art.
FIG. 1B depicts solar cell 100B in the prior art.
FIG. 1C depicts solar cell 100C in the prior art.
FIG. 1D depicts solar cell 100D in the prior art.
FIG. 1E depicts solar cell 100E in the prior art.

DETAILED DESCRIPTION

Figure 2:
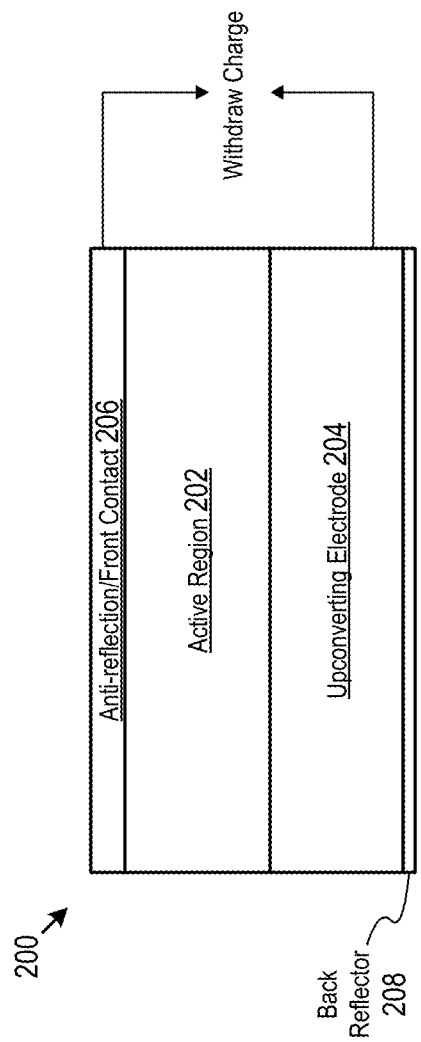
FIG. 2 depicts solar cell 200 in accordance with the illustrative embodiment of the present invention.

FIG. 2 depicts notional solar cell 200 in accordance with the illustrative embodiment of the present invention. Cell 200 includes optically active region 202, up-converting electrode 204, anti-reflection layer/front contact 206, and back reflector 208.

Optically active region 202 can comprise any semiconductor material used in photovoltaic cells or in the photoactive working conductor of a photoelectrochemical cell. For example, and without limitation, in various embodiments, optically active region 202 comprises hydrogenated amorphous crystalline silicon, polycrystalline silicon, nanocrystalline silicon, cadmium telluride, copper-indium-gallium-selenide, copper-indium-gallium-diselenide, copper-indium-disulfide, III-V compound semiconductors (e.g., InP, GaN, InN, InGaN, InGaAs, InGaAsP, InGaP, InGaAlAs, etc.), II-VI compound semiconductors (e.g., HgCdTe, ZnSe, CdS, CdSe, CdZnTe, HgCdTe, $Cu_2ZnSnS_4$, etc.), ternary compound semiconductors, quaternary compound semiconductors, organic semiconductors, and the like.

The band gap for most of the semiconductors used in the optically active region is in the range of about 1.1-1.7 eV, which correlates to wavelengths in the range of about 1100 nanometers (nm) to about 730 nm. The correspondence of electrical band gap and band gap wavelength is defined by the relation $E_g=hc/\lambda_{bg}$, where $E_g$ is the energy band gap, h is Planck's constant, c is the speed of light in vacuum, and $\lambda_{bg}$ is the bandgap wavelength. As one skilled in the art will recognize, a solar cell having a bandgap wavelength of 710 nm, for example, will have good absorptivity for light having wavelengths less than approximately 700 nm. Absorptivity for light having wavelengths longer than 700 nm falls off rapidly, so that much of the sunlight's energy spectrum is "wasted."

The thickness of the optically active region varies as a function of its composition and type, but is typically in the range of about 1 micron to about 500 microns.

Up-converting electrode 204 comprises a hybrid "film" of (a) an up-converting material and (b) an electrically conductive material. In the illustrative embodiment, the up-converting material and the electrically conductive material have nanoscale dimensions. More particularly, the up-converting material is in the form of a "nanoparticle" and the electrically conductive material is in the form of a "nanorod" or "nanowire" or "nanotube". As used herein, the term "nanoparticle" refers to particles, which typically but not necessarily have a polygonal shape, and a largest dimension of less than about 500 nm. As used herein, the terms "nanowire" or "nanorod" or "nanotube" refer to structures that have a diameter that is less than about 500 nm and a length up to about 50 microns. In presently preferred embodiments of the present invention, the nanowire will have diameter in the range of about 50 to 100 nm and a length in the range of about 10 to 20 microns.

In some embodiments, the up-converting material comprises a lanthanide. In the illustrative embodiment, the up-converting material is $NaYF_4:Yb^{3+}$, $Er^{3+}$ nanoparticles. In some other embodiments, other host lattices for the lanthanide (e.g., $Er^{3+}$, etc.) are used, such as oxides or other fluorides. In yet some additional embodiments, the up-converting materials includes metallated macrocyles in polymer hosts or encapsulated in polymer beads.

In some embodiments, the electrically conductive material comprises a metal, such as, without limitation, copper, silver, or gold. In the illustrative embodiment, the electrically conductive material comprises silver (Ag) nanowires or nanorods. In some further embodiments, the electrically conductive material is a carbon nanotube.

The thickness of the hybrid film is typically in the range of about 500 nm to 1 micron. In some embodiments, the up-converting material and the electrically conductive material are supported on a substrate, such as glass, plastic, etc.

Up-converting electrode 204 is (at least) bi-functional in the sense that it is capable of providing an optical (up-converting) function and an electrical (conductivity) function. Regarding the optical function, up-converting electrode 204 absorbs photons that have passed through optically active region 202 as a consequence of those photons having an energy that is less than the band gap of the semiconductor material in the active region. The up-converting material emits photons having higher energy than those it absorbed. The emitted photons are directed to optically active region 202 where they will be absorbed to the extent that they have an energy that is above the band gap. Only those photons absorbed in optically active region 202 participate in the generation of electricity from a solar cell.

In the illustrative embodiment, the electrical function is provided by silver (Ag) nanowires, which enable the up-converting electrode 204 to serve as one of the electrical contacts of the solar cell. Ag nanowires are known in the art for forming transparent electrodes. See, Hu, et al., "Scalable Coating and Properties of Transparent, Flexible, Siver Nanowire Electrodes," *ACS Nano* vol. 4, no. 5, p 2955-63, (2010).

Those skilled in the art will recognize that a solar cell, such as solar cell 200, includes other layers/features, such as a front-side or top electrical contact/electrode and, usually, an anti-reflection layer, and other packaging related layers/features. Layers/features that are situated "above" active region 202 are collectively referenced "anti-reflection/front contact 206". The front electrical contact provides one of the two electrical contacts required for solar cell 200 (up-converting electrode 204 is the other contact in the illustrative embodiment). That is, the front electrical contact and up-converting electrode 204 create electrical connectivity to optically active region 202 and provide the contact points for withdrawing charge from the solar cell 200.

The ability to couple light into or out of a device often depends upon the characteristics of an anti-reflection layer (a.k.a., AR coating) that is disposed on the surface of the device. In solar cell 200, the anti-reflection layer ameliorates the effect of a relatively large mismatch that normally exists between the refractive indices of the semiconductor (optically active layer 202) and air, which otherwise results in high-reflectivity at the interface of the two materials.

Back reflector 208 is disposed "behind" or "beneath" up-converting electrode 204 to prevent light from escaping from the bottom of cell 200. In some embodiments, back reflector 208 is a layer of silver having a thickness of approximately 100 nm. Silver provides high reflectivity for light having a wavelength within the range of interest for most solar cells. But in some alternative embodiments, back-reflector 208 comprises a reflective layer other than silver. Back-reflector 208 is formed using conventional metal deposition techniques.

As will be appreciated by those skilled in the art, still additional features/layers may be present in a solar cell such as solar cell 200. Neither such additional features/layers, nor anti-reflection layer/front contact 206, nor back-reflector 208 are described further because they are not germane to an understanding of the present invention. It will be clear to one skilled in the art how to specify, make, and use these features.

Figure 3:
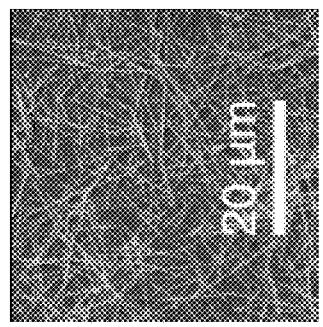
FIG. 3 depicts a micrograph of $NaYF_4:Yb^{3+}$, $Er^{3+}$ nanoparticles, which provide the up-converting functionality in conjunction with the present invention.
Figure 4:
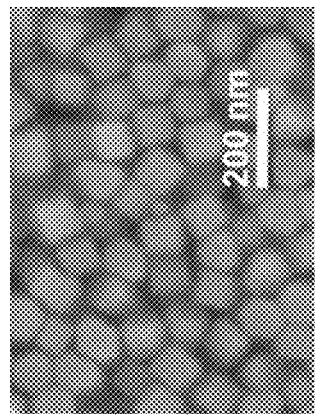
FIG. 4 depicts a micrograph of silver nanowires, which provide electrical conductivity and enhancement of up-converting functionality in conjunction with the present invention.

FIG. 3 depicts a micrograph of hexagonal phase $NaYF_4$: $Yb^{3+}$, $Er^{3+}$ nanoparticles, such as form a portion of up-converting electrode 204. FIG. 4 depicts a micrograph of silver nanowires, which also form a portion of up-converting electrode 204.

Figure 5C:
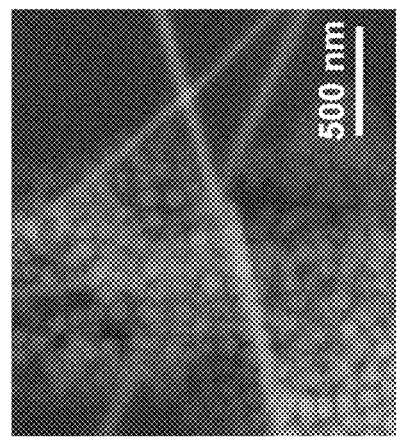
FIGS. 5A-5C depict, at various magnifications, micrographs of an up-converting electrode in accordance with the present teachings.
Figure 5B:
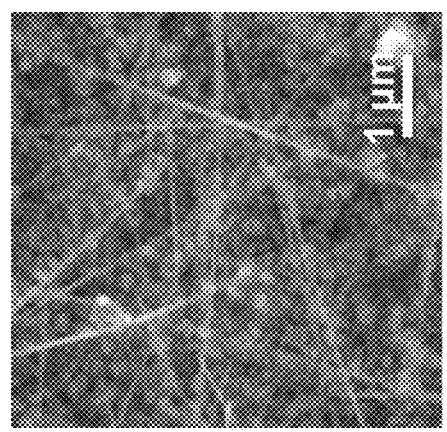
Figure 5A:
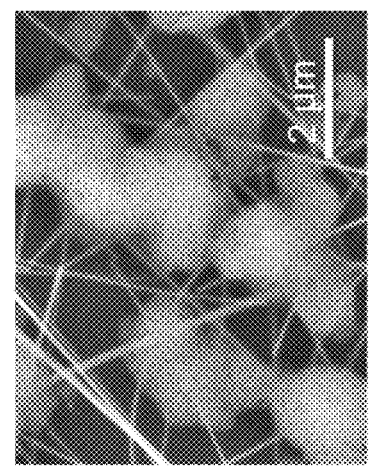

FIGS. 5A through 5C depict micrographs, at various magnifications, of an up-converting electrode in accordance with the illustrative embodiment of the present invention. The micrographs show the presence of Ag nanowires, which appear as slender sticks/rods/wires and $NaYF_4:Yb^{3+}$, $Er^{3+}$ nanoparticles. In FIG. 5A, which is at the lowest magnification, individual nanoparticles are barely discernable and can be seen to "clump" together to form irregular shapes. At double the magnification of FIG. 5A, discrete nanoparticles are more readily visible in FIG. 5B. And in FIG. 5C, which is at double the magnification of FIG. 5B, the polygonal shape of the nanoparticles is discernable.

Figure 6A:
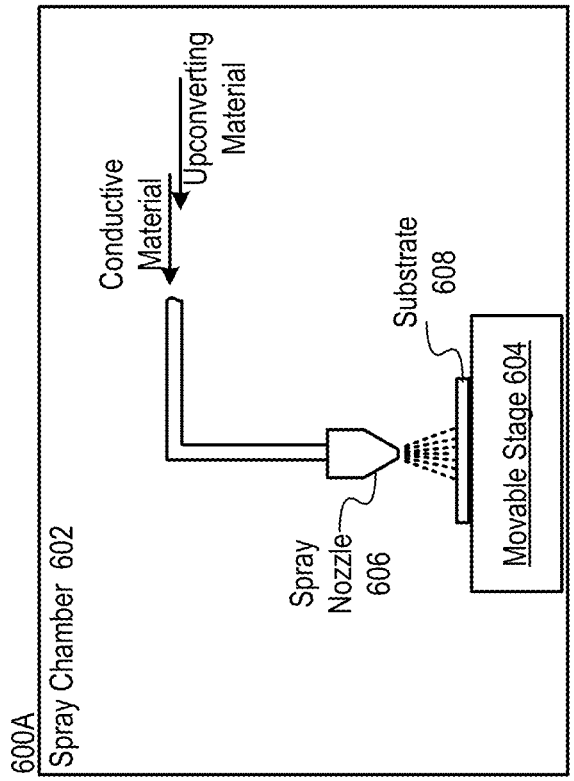
FIG. 6A depicts a spray deposition apparatus for forming the up-converting electrode of FIG. 5.
Figure 6B:
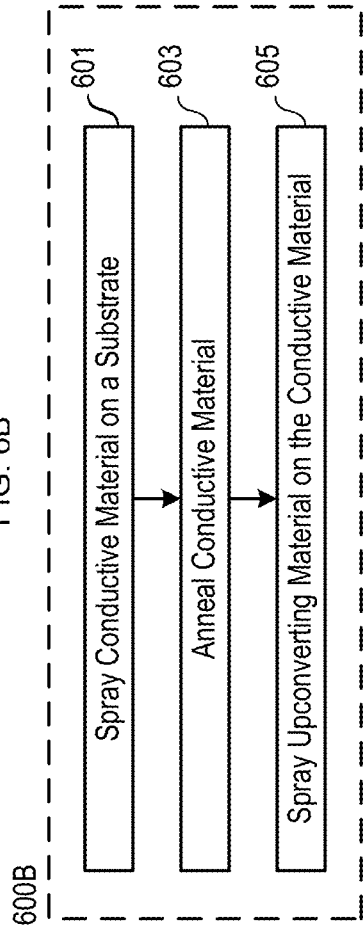
FIG. 6B depicts a method for forming the up-converting electrode of FIG. 5 using the apparatus of FIG. 6A.

FIG. 6A depicts apparatus 600A for forming an up-converting electrode and FIG. 6B depicts method 600B for forming the up-converting electrode using apparatus 600A.

Referring to FIGS. 6A and 6B, apparatus 600A is a spray deposition apparatus that, in the illustrative embodiment, is used to form up-converting electrode 204. The spray deposition process and apparatuses for spray deposition are well known to those skilled in the art. The salient features of spray deposition apparatus 600A include spray chamber 602, temperature-controlled movable stage 604, and spray nozzle 606.

Spray deposition takes place in chamber 602 under air, nitrogen, or other inert gas. Substrate 608 is placed in chamber 602 on movable stage 604. The substrate can be, for example and without limitation, glass, such as 0.15 mm thick×25 mm square glass commercially available from Warner Instrument Corporation of Hamden, Conn. or others. The substrate temperature can be in a range from about room temperature to about 200° C.

In accordance with operation 601 of method 600B, the electrically conductive material, which in the illustrative embodiment is Ag nanowire, is sprayed onto substrate 608. For the spraying process, the nanowires are dispersed in a carrier fluid, such as isopropyl alcohol. To create a uniform, flat film on the substrate, substrate 608 is moved past spray nozzle 606 by movable stage 604 as the conductive material is being sprayed. Ag nanowires are commercially available from Seashell Technologies of La Jolla, Calif. and others.

After spray depositing the electrically-conductive material in operation 601, the resulting film of conductive material is (optionally) annealed (e.g., such as via laser annealing, etc.) to increase electrical conductivity in optional operation 603.

After annealing (if performed), the up-converting material is sprayed onto the the film of electrically-conductive material that has been formed on substrate 608, as per operation 605. In the illustrative embodiment, the up-converting material is $NaYF_4:Yb^{3+}, Er^{3+}$ nanoparticles, which can be synthesized via known techniques. See, e.g., Li et al., *Adv. Mater.*, v20, 4765-4769 (2008). For spraying, the up-converting nanoparticles are dispersed in a carrier fluid, such as cyclohexane. During the spraying operation, substrate 608 is moved past spray nozzle 604.

Control parameters for obtaining a uniform, flat film of up-converting material and electrically conductive material on the substrate (i.e., the up-converting electrode) include: rastering velocity and patterns (of the substrate), substrate temperature, nanoparticle/nanowire injection rate, nozzle-to-substrate distance, and spray pressure. And these same parameters can be adjusted to obtain a desired film thickness and particle distribution on the substrate, as determined by simple experimentation.

In some alternative spray-deposition systems, spray nozzle 604 is movable while substrate 608 remains immobile. Furthermore, although the presently preferred technique is to deposit the electrically conductive material first and then the upconverting material, in some other embodiments, the up-converting material is deposited before the electrically conductive material. And in some further embodiments, the up-converting material and the electrically conductive material are deposited at the same time (through different nozzles or the same nozzle).

In some other embodiments, different apparatuses and methods are used to form the up-converting electrode. For example, doctor-blading and inkjet printing techniques and apparatuses can be used to deposit the electrically conductive material (e.g., Ag nanowires, etc.) and the up-converting nanoparticles on to a substrate to form an up-converting electrode. Any technique used for depositing colloidal nanostructures, as known to those skilled in the art, can suitably be used.

EXAMPLE

Ag nanowires (from Seashell Technologies) having an average length of about 10 microns and an average diameter of about 50 nanometers were spray deposited onto 25 mm square, 0.15 mm thick glass substrates. The deposited nanowires were then laser annealed. Hexagonal-phase $NaYF_4:18\% Yb^{3+}, 2\% Er^{3+}$ nanoparticles were synthesized via techniques discussed in Li et al., *Adv. Mater.*, v20, 4765-4769 (2008). The particles were dispersed in cyclohexane, as a carrier fluid, at a concentration of about 5 mg of nanoparticles per milliliter of carrier fluid. The nanoparticles were then spray deposited on the Ag nanowires that had been deposited on the substrate, forming a film (i.e., the upconverting electrode) containing both up-converting particles and electrically conductive material. For comparison with the up-converting electrode, hexagonal-phase $NaYF_4: 18\% Yb^{3+}, 2\% Er^{3+}$ nanoparticles were sprayed deposited on substrates that did not include any Ag nanowires. Also, for electrical measurements, substrates were prepared with only Ag nanowires (no up-converting nanoparticles).

The up-converting electrode and the Ag nanowires sans up-converting material were characterized electrically using a four-point probe. The up-converting electrode and the up-converting material sans Ag nanowire were characterized optically using a 980 nm laser diode for excitation (300 mW). The up-converted light was characterized using a spectrograph (150 blaze grating) and CCD.

Figure 7:
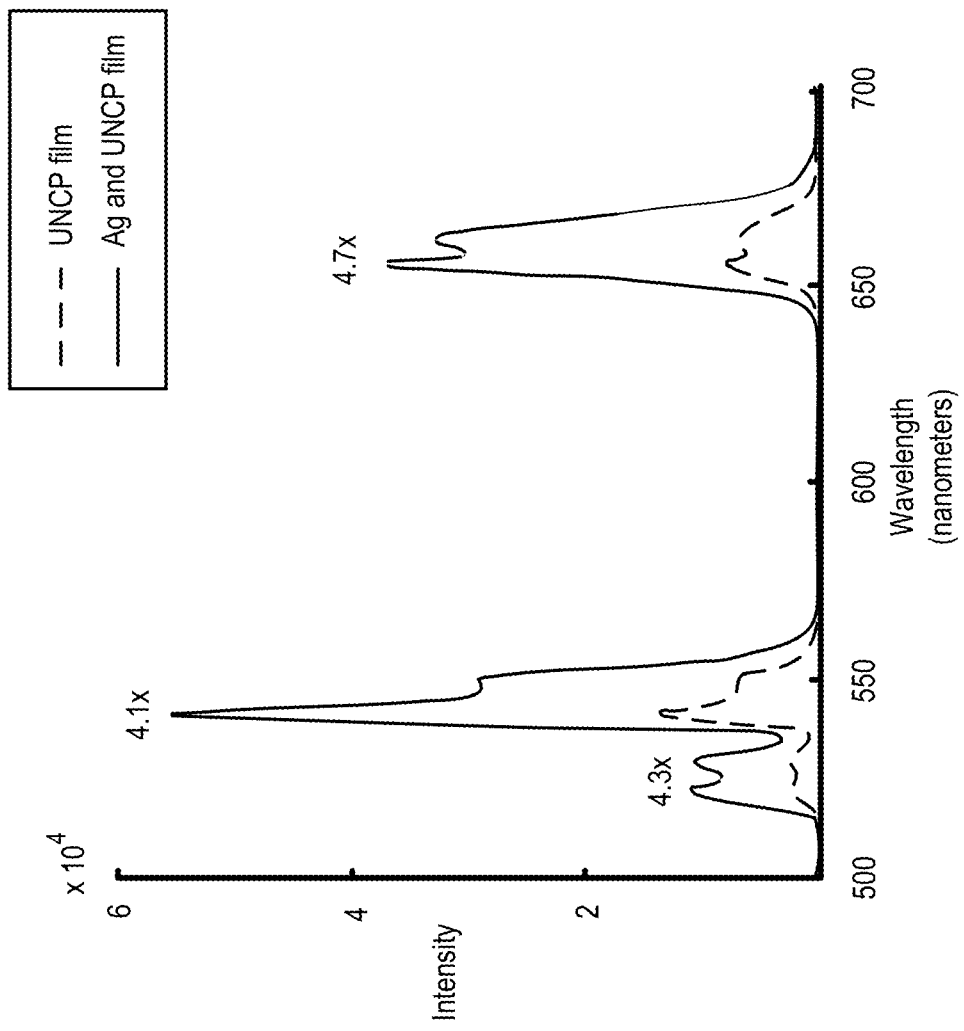
FIG. 7 depicts a plot of intensity versus wavelength comparing the up-conversion performance of $NaYF_4:Yb^{3+}$, $Er^{3+}$ nanoparticles alone and when combined with silver nanowires.

The emission spectra for up-converted light generated from the up-converting material alone ("dashed" line) and for the up-converted light generated from the up-converting electrode ("solid" line) are depicted in FIG. 7. The up-converting material used (whether alone or combined with the electrically conductive material) up-converts 980 nm photons to red and green light (i.e., about 700 to about 500 nm).

As depicted in FIG. 7, the up-converting electrode (i.e., the combination of up-converting material and the electrically conductive material) increases the amount of up-converted photons, relative to using the upconverting material alone, by a factor of 4 to 5.

Furthermore, it has been observed that the presence of the electrically conductive material enables up-conversion to occur at lower power densities. It was determined experimentally that up-conversion emission occurs at about 2.5× lower density for the up-converting electrode as compared to upconverting material alone.

The sheet resistance of the Ag nanowire film (without up-converting material) was 6.0+/−1.7 ohms/square. The sheet resistance of a film that included both the Ag nanowires and the up-converting material was 6.5+/−1.1 ohm/square. Electrical conductivity can be further increased (i.e., resistance decreased) by increasing the density of the electrically conductive material in the film; that is, for example, having more Ag nanowires present in the film.

Without being bound to any particular theory, it is believed that one of the following two mechanisms, and possibly both, contribute to the ability of the electrically conductive material to enhance up-conversion efficiency.

One mechanism that is believed to enhance up-conversion is increased light scattering. In particular, it is theorized that the nanowires increase light scattering, which leads to a longer path length for the incident infrared (sub band gap) light. This increases the likelihood that such sub band gap light will interact with the up-converting material and be up-converted.

To evaluate this theory, measurements of the "haze" of the up-converting electrode versus up-converting material alone were obtained. The parameter "percent haze" was determined, which is the fraction of diffuse transmission over total transmission; it indicates how well a film scatters light.

The measurement was performed using a spectrometer with an integrating sphere attachment (Cary 6000i with DRA).

The percent haze for the up-converting electrode varied from a maximum of about 17% (400 nm light) to a minimum of about 10.5% (700 nm light). The percent haze increased approximately linearly above 700 nm to about 11.5% at 1200 nm. The percent haze for the up-converting material alone (NaYF$_4$:Yb$^{3+}$, Er$^{3+}$) was fairly constant at about 2.5% from 400 to 1200 nm. This result (greater haze for the up-converting electrode versus the up-converting material alone) is consistent with the proposed theory.

Furthermore, the observed enhancement in up-converting performance might be plasmonic in nature. Plasmons are oscillations of electrons in a metal. These oscillations can be due to the interaction of the electrons with light. The nano-structures (e.g., Ag nanowires) can act as "antennas" to concentrate the intensity of light in the near field. In the up-converting electrode, the plasmon resonance of individual Ag nanowires might overlap with either the absorption or emission bands, or both, of the up-converting nanoparticles. More particularly, the absorption of lower energy photons would be improved by concentration of the excitation field and emission of up-converted photons would be improved by coupling to radiative transitions.

The frequency of plasmon resonance is highly dependent on the geometry (e.g., diameter, length, shape) of the metal nanostructure (e.g., the Ag nanowires, etc.). As such, small changes in nanowire geometry can be used to "tune" the plasmon resonance; that is, to increase the overlap with Yb$^{3+}$ absorption and Er$^{3+}$ emission, thereby enhancing up-conversion. As such, theoretical predictions (e.g., scattering cross section of the nanowires; extinction cross section as function of nanowire length and the wavelength of the incident light, etc.) can form the starting point for experimentation to optimize nanowire geometry for a specific up-conversion material, such as NaYF$_4$:Yb$^{3+}$, Er$^{3+}$.

Figure 8:
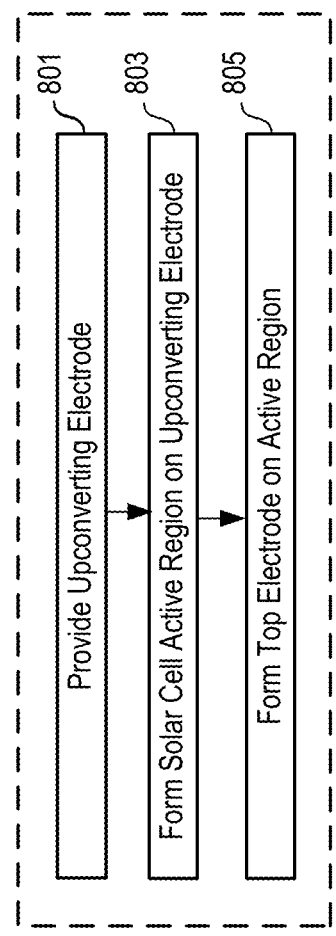
FIG. 8 depicts a method for forming a photovoltaic that incorporates an up-converting electrode.

FIG. 8 depicts method 800 for forming a photovoltaic cell, such as cell 200 depicted in FIG. 2.

In accordance with operation 801 of method 800, an up-converting electrode is formed. This is accomplished, for example, using method 600B and apparatus 600A.

In operation 803, the active region of the solar cell is formed on the up-converting electrode. The details of this operation (which will include several sub-operations) is a function of the semiconductor materials used for the active region and the type of solar cell being fabricated. It is within the capabilities of those skilled in the art to form the active region of the solar cell.

At operation 805, a top electrode is formed on the active region in known fashion.

Those skilled in the art will recognize that additional features (e.g., one or more anti-reflection layers, a back reflector, etc.) as previously mentioned is normally part of a solar cell, such as solar cell 200. These features would, of course, be formed at the appropriate time during fabrication of solar cell 200. Those skilled in the art will know how and when to form such features in conjunction with the fabrication of solar cell 200. Such operations are not depicted in the drawings or recited in the claims because they are not germane to the present invention.

After reading the present disclosure, those skilled in the art will be able to form a photoelectrochemical cell that includes an up-converting electrode.

Although an up-converting electrode in accordance with the present teachings possesses an electrical conductivity that enables it to serve as an electrode in a solar cell (or other applications), it need not function as such. That is, as previously discussed, the presence of the up-converting electrode in a solar cell can be justified solely based on its ability to enhance the up-conversion process. Its use as an electrode/electrical contact is an ancillary benefit. As such, it is contemplated that in some embodiments, solar cells that include the up-converting electrode will also include a separate electrical contact feature/layer. In such cells, the up-converting electrode will only serve an optical (up-converting) function. As such, the word "electrode" in the moniker "up-converting electrode" is not intended to be limiting or otherwise require the up-converting electrode to function as an electrode/electrical contact, whether it is used in a solar cell or for any other application.

It is to be understood that the disclosure teaches just one example of the illustrative embodiment and that many variations of the invention can easily be devised by those skilled in the art after reading this disclosure and that the scope of the present invention is to be determined by the following claims.

What is claimed is:

1. An article comprising an up-converting electrode, wherein the up-converting electrode consists essentially of:
   a material that is capable of up-converting light having a wavelength greater than about 730 nanometers to light having a wavelength that is less than 730 nanometers; and
   metallic nanowires having a plasmonic resonance that overlaps at least one of an absorption or emission of the material that is capable of up-converting light, wherein the metallic nanowires and the material that is capable of up-converting light are intermingled with one another forming a substantially uniform, electrically conductive, single layer hybrid film that is capable of functioning as an electrical contact for withdrawing charge from the article.

2. The article of claim 1 wherein the metallic nanowires are silver nanowires.

3. The article of claim 1 wherein the material comprises a lanthanide.

4. The article of claim 1 wherein the material comprises a lanthanide nanoparticle.

5. The article of claim 1 wherein the material is NaYF$_4$: Yb$^{3+}$, Er$^{3+}$ nanoparticles.

6. The article of claim 1 wherein the the metallic nanowires are silver nanowires and the material comprises NaYF$_4$: Yb$^{3+}$, Er$^{3+}$ nanoparticles.

7. The article of claim 1 wherein the article is a selected from the group consisting of a photovoltaic cell and a photochemical cell.

8. The article of claim 1 further comprising:
   an optically active region, wherein the optically active region absorbs photons having a wavelength less than about 730 nanometers and generates an electrical current therefrom, wherein the optically active region is disposed on the up-converting electrode.

9. The article of claim 8 further comprising a top electrical contact, wherein the top electrical contact is disposed on the optically active region.

10. A method comprising:
   a) forming an upconverting electrode, the upconverting electrode consisting essentially of including:
      (i) a material that is capable of upconverting light having a wavelength greater than about 730 nanometers to light having a wavelength that is less than 730 nanometers;
      (ii) metallic nanowires having a plasmonic resonance that overlaps at least one of an absorption or emission of the material that is capable of up-converting light, wherein the metallic nanowires and the material that is capable of up-converting light are intermingled with one another forming a substantially uniform, electrically conductive, single layer hybrid film; and b) forming an optically active layer on the upconverting electrode, wherein the optically active layer comprises a semiconductor.

11. The method of claim 10 wherein the operation of forming an up-converting electrode further comprises spray depositing the metallic nanowires on a substrate and spray depositing the material that is capable of upconverting light on the metallic nanowires.

12. The method of claim 11 wherein the metallic nanowires are selected from the group consisting of silver nanowires, copper nanowires, and gold nanowires.

13. The method of claim 11 wherein the material capable of upconverting light comprises lanthanide nanoparticles.

14. The method of claim 13 wherein the material capable of upconverting light is $NaYF_4$: $Yb^{3+}$, $Er^{3+}$ nanoparticles.

15. The method of claim 10 wherein the metallic nanowires are silver nanowires and the material capable of upconverting light comprises $NaYF_4$: $Yb^{3+}$, $Er^{3+}$ nanoparticles.

16. An article comprising an up-converting electrode, wherein the up-converting electrode comprises a substantially uniform, electrically conductive, single layer hybrid film consisting of:
a material that is capable of up-converting light having a wavelength greater than about 730 nanometers to light having a wavelength that is less than 730 nanometers; and
metallic nanowires having a plasmonic resonance that overlaps at least one of an absorption or emission of the material that is capable of up-converting light, wherein, when intermingled in the hybrid film with the material that is capable of up-converting light, the metallic nanowires increases generation of upconverted photons by a factor of at least four, relative to using the first material that is capable of up-converting light alone.

17. An article comprising an up-converting electrode, wherein the up-converting electrode consists of:
a material that is capable of up-converting light having a wavelength greater than about 730 nanometers to light having a wavelength that is less than 730 nanometers; and
metallic nanowires having a plasmonic resonance that overlaps at least one of an absorption or emission of the material that is capable of up-converting light, wherein the metallic nanowires and the material that is capable of up-converting light are intermingled with one another forming a substantially uniform, electrically conductive, single layer hybrid film that is capable of functioning as an electrical contact for withdrawing charge from the article.

18. An article comprising an up-converting electrode, wherein the up-converting electrode consists of:
a material that is capable of up-converting light having a wavelength greater than about 730 nanometers to light having a wavelength that is less than 730 nanometers; and
metallic nanowires selected from the group consisting of silver nanowires, copper nanowires, and gold nanowires, wherein the metallic nanowires and the material that is capable of up-converting light are intermingled with one another forming a substantially uniform, electrically conductive, single layer hybrid film that is capable of functioning as an electrical contact for withdrawing charge from the article.

* * * * *